MECHANICAL TO ELECTRICAL SEMICONDUCTOR TRANSDUCER

Filed Aug. 20, 1964 2 Sheets-Sheet 1

United States Patent Office 3,460,004

Patented Aug. 5, 1969

3,460,004
MECHANICAL TO ELECTRICAL SEMICONDUCTOR TRANSDUCER

Walter Heywang, Munich, Germany, assignor to Siemens Aktiengesellschaft, a corporation of Germany Filed Aug. 20, 1964, Ser. No. 390,981
Int. Cl. H01l 15/00
U.S. Cl. 317—235 12 Claims

ABSTRACT OF THE DISCLOSURE

An elongated piezoresistive semiconductor body has at least two adjacent layers of different conductivity type extending along the length of the semiconductor body and forming a p-n junction therein. The semiconductor body has spaced opposite first and second ends. An electrically conductive bridge electrically connects the layers of different conductivity type at the first end of the semiconductor body and the semiconductor body is supported at the second end thereof. A biasing arrangement contacts each of the conductivity layers of the semiconductor body at the second end thereof for biasing the p-n junction in the reverse direction. A deforming device applies a deformation force to the semiconductor body to vary the piezoresistive effect in the conductivity layers and to control the space charge in the region of the p-n junction thereby varying the cross-section and length of the current path in the semiconductor body.

My invention relates to a transducer for converting mechanical to electrical oscillations. More particularly, my invention relates to a transducer having a body of piezoresistive semiconductor material subjected to a deforming force.

It is known to use piezoresistive semiconductors for converting mechanical to electrical oscillations. The piezoelectric effect manifests itself by a change in electrical conductivity of the semiconductor material in dependence upon a mechanical force or pressure acting upon the semiconductor. This effect has been observed in various semiconductor materials, such as silicon and germanium, and of some $A_{III}B_{V}$ compounds such as, for example, gallium arsenide.

Transducers with a piezoresistive semiconductor body can be used, for example, as microphones and pickups for sound recordings, acceleration measuring devices or generally for converting mechanical deflections into electrical signals.

An object of the present invention is to increase the sensitivity of transducers of the type mentioned.

In accordance with the present invention, the converting of mechanical to electrical oscillations is effected by means of a piezoresistive semiconductor body. The semiconductor body has at least one p-n junction which is biased in the reverse or blocking direction. A charge-carrier flow occurs in the semiconductor body substantially parallel to the p-n junction in the adjacent layers. The control of the cross section and the length of the current path are dependent upon a force applied for deforming the semiconductor body. If a force effecting deformation is applied to such a semiconductor body, the resistance of the semiconductor layers, bordering the p-n junction and biased in the reverse direction, is changed due to the piezoresistive effect. This resistance change alters the blocking voltage at the p-n junction. The changes in the cross section and in the length of the effective current path, due to the unipolar field effect, cause an additional resistance change in the semiconductor layer, augmenting the piezoresistive effect.

It is particularly advantageous, in connection with the present invention, if one of the two layers bordering the p-n junction is relatively high-ohmic, as compared with the other layer. In this manner, the space charge zone, by applying stress to the p-n junction in the reverse direction, extends essentially into the high-ohmic zone. If the high-ohmic zone, according to another feature of the invention, is at least patrially formed as thinly as possible, such as in places or spots of maximum distortion compared to the low-ohmic zone, a strong resistance change of the high-ohmic zone or layer, upon variation of the penetrating depth of the space charge zone, is obtained.

When a semiconductor body, such as a rod, particularly if clamped at only one end, is subjected to a bending force, it is preferable that the high-ohmic layer constitute a surface layer of the semiconductor body. This is advantageous because, in this instance, the bending strain is greatest at the outer surface of the transducer. Preferably, the semiconductor body should always be so designed that the high-ohmic layer lies at the point of maximum distortion.

Tests with piezoresistive semiconductor bodies have shown that the piezoresistive effect in certain crystallographic directions, so-called preferred orientations, is especially great. Therefore, according to the invention, the load is preferably applied, particularly as to the high-ohmic layer, in the direction of the maximum piezoresistive effect. In a semiconductor body made of silicon, in which the high-ohmic layer is of a n-conductivity type, loading occurs, according to the invention, in the 100 direction.

In accordance with the present invention, in order to obtain considerable distortions, that is deformations of the semiconductor body with relatively low magnitude forces, such as forces which do not yet result in the distortion of the semiconductor body, the semiconductor body is provided with a cross-section reduction running perpendicular to the force effecting the deformation.

When the transducer of the present invention is utilized as a microphone, the effect of force upon the semiconductor body is in acordance with the oscillations of a diaphragm.

In order that the present invention may be readily carried into effect, it will now be described with reference to the accompanying drawings, wherein.

Figure 1:
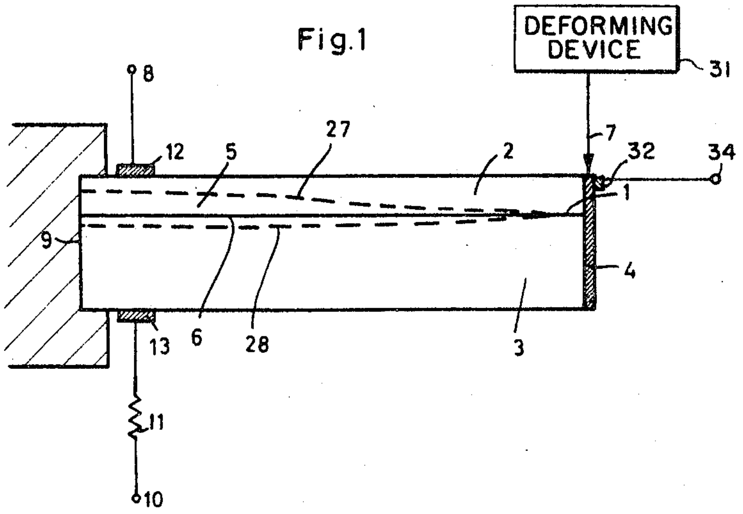
FIG. 1 is a view of an embodiment of the transducer of the present invention, including a semiconductor body subjected to a bending force and clamped at only one end.

In FIG. 1, a semiconductor body comprises, for exexample, silicon and has an n conductivity type, high-ohmic and relatively thin zone 2, lying at the outer surface, and a p-conductivity type, low-ohmic and relatively thick zone 3. The two semiconductor zones or layers 2 and 3 form a p-n junction 1. The semiconductor body is of substantially rod-like configuration and is clamped tightly at one of its ends 9. The other end of the semiconductor body is ohmically bridged by means of a metal layer or coating 4. The ohmic bridge 4 permits, at the end of the semiconductor body, a charge-carrier flow over the p-n junction 1 which is biased in the reverse direction.

At the clamped end, the semiconductor body is provided with two ohmic connections or electrodes 12 and 13, which contact the n conductivity type zone 2 and the p-conductivity type zone 3, respectively. Voltage is applied to terminals 8 and 10 of the contacts 12 and 13, respectively. The voltage applied to the terminals 8 and 10 biases the p-n junction 1 in the reverse direction. In the embodiment of FIG. 1, where the semiconductor body comprises an n-conductivity type zone 2 and a p-conductivity type zone 3, the terminal 8 is connected to the positive pole of the voltage source and the terminal 10 to the negative pole of the voltage source.

Due to the application of a blocking voltage, a space charge zone is created on both sides of the p-n junction 1. Since the zone 2 should be relatively high-ohmic compared to zone 3, the depth of penetration of the space charge zone is relatively high so that it expands primarily in the zone 2. The space charge zone 5 in the layer 2 is bonded by a broken line 27 and the space charge zone 6 in the low-ohmic layer 3 is bounded by a broken line 28.

The penetrating depth of the space charge zone 5, 6 is highest between the contacts 12 and 13. It decreases as it approaches the ohmic bridge 4, since in the area of the semiconductor body closely adjacent said bridge there is practically no potential difference between the layers 2 and 3.

When the semiconductor body is subjected to force, in the direction of the arrow 7, the resistance in the layers 2 and 3 increases, due to the piezoresistive effect. The resistance increases especially in the high-ohmic layer 2. The increase in resistance in the layer 2 brings about a shift in the space charge zone, so that the boundary 27 shifts and the boundary 28 shifts to a much smaller extent. This results in an expansion of the space charge zone. The force or pressure is applied by a deforming device 31, which may constitute any suitable arrangement for applying pressure in a determined direction or directions.

The expansion of the space charge zone, in turn, changes the resistance, especially of the high-ohmic layer 2. This is due to the fact that, similar to the unipolar transistor, the shift in the space charge zone causes a narrowing of the current path or a change in the length of the narrowed current path. This results in an increase in resistance, so that it is very important for the layer 2 to be very thin.

The increase in resistance results in an increased voltage drop along the semiconductor body between the contact 12 and the ohmic bridge 4, and augments the piezoresistive effect. Hence, the transducer device of the present invention has a higher sensitivity, as compared to known devices which do not have a p-n junction biased in the reverse direction.

The effect is best when the effective semiconductor layer, which in this case is the thin, high-ohmic zone 2, is loaded in the direction of the maximum piezoresistive effect; that is, when using an n conductivity type silicon layer, as in the present illustrative example, in the 100 direction. In order to ensure that maximum voltage is derived, it is preferred to develop the surface layer 2 in such a way that its thinnest portion lies at the point of maximum distortion and that it is low-ohmically connected to the contact 12.

Figure 3:
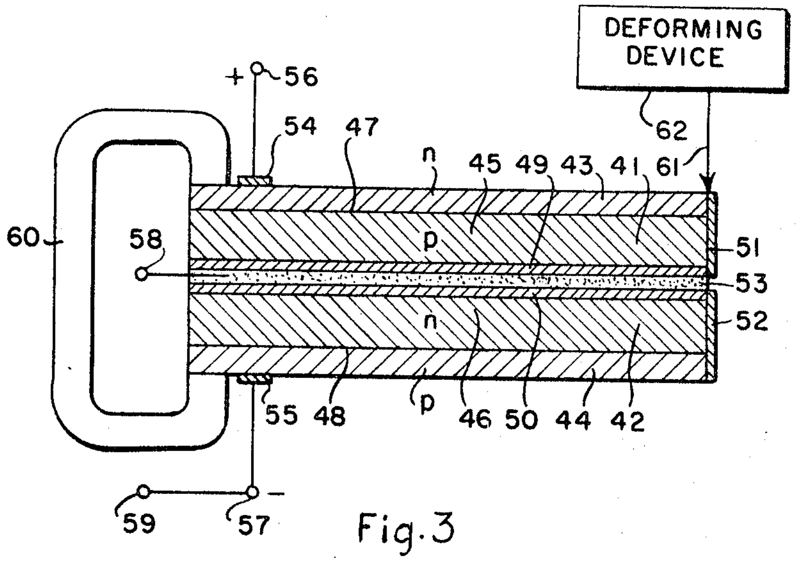
FIG. 3 is a view, partly in section, of still another embodiment of the transducer of the present invention, utilizing two semiconductor bodies.

A resistance 11, which is matched to the resistance of the semiconductor, is provided in the circuit formed by the p-n junction 1 and the voltage source which supplies the blocking voltage. In accordance with an additional feature of the invention, for the purpose of increasing sensitivity, the resistance 11 may be replaced by the same strip of semiconductor material as the semiconductor body 2, 3, as that of FIG. 1. If the second strip is stressed in the opposite direction from the first one, the effect is doubled. An embodiment of the invention utilizing two semiconductor bodies in such an arrangement is shown in FIG. 3. Furthermore, several of the same semiconductor bodies may be provided, connected in series with the first one and subjected to a force acting in the opposite direction.

When the semiconductor device of FIG. 1 is utilized as a microphone, the diaphragm is preferably connected to the free end of the semiconductor body by means of a rigid connecting member. During deflection of the diaphragm, the rod is deformed in the direction of the deflecting force or deflection and the sound vibrations impinging upon the diaphragm are converted into corresponding deformations of the rod.

The output voltage produced by the semiconductor body 2, 3 may be derived from said semiconductor body by any suitable electrode devices such as, for example, the contact 12 and contact 32. The terminal 8 is connected to the contact 12 and terminal 34 is connected to the contact 32. The contact 12 is positioned at the end of the semiconductor body which is clamped and the contact 32 is preferably positioned at the end of said semiconductor body which is bridged. The output voltage may also be derived from the resistor 11.

Figure 2:
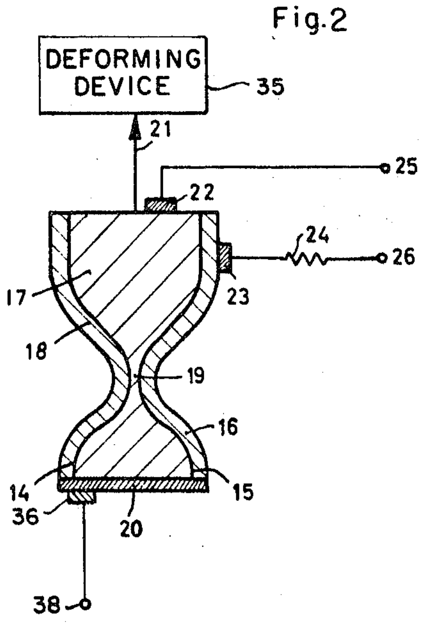
FIG. 2 is a view, partly in section, of another embodiment of the transducer of the present invention, including a semiconductor body having a constriction and subjected to a tensile force.

Another embodiment of the invention is depicted in FIG. 2. In the embodiment of FIG. 2, the semiconductor body may again comprise, for example, silicon. The semiconductor body comprises p-conductivity type layers 16 and 18 and an n-conductivity type layer 17. The n-conductivity type layer or zone 17 adjoins the p conductivity type layer or zone 16 to form a p-n junction 15 and said n conductivity type zone adjoins the p conductivity type layer or zone 18 to form a p-n junction 14.

In the embodiment of FIG. 2, the semiconductor zone 17 comprises high-ohmic semiconductor material, whereas the layers 16 and 18 do not comprise high-ohmic material. The greatest mechanical stress is at constriction 19 when the semiconductor body is subjected to a tensile force in the direction of arrow 21. The force or pressure is applied by a deforming device 35, which may constitute any suitable arrangement for applying a pressure in a determined direction or directions.

The semiconductor n conductivity zone 17 is provided with an ohmic connection or electrode 22 and the p conductivity type zone 16 is provided with a connection or electrode 23. Voltage is applied to terminals 25 and 26 of the contacts 22 and 23, respectively. The voltage applied to the terminals 25 and 26 biases the p-n junction 15 in the reverse direction.

An ohmic bridge 20 comprising a meal layer or coating short-circuits both p-n junctions 14 and 15 at the end of the semiconductor body at which said bridge is located. The p-n junction 14 is also biased in the reverse direction.

When a blocking voltage is applied, the space charge zone penetrates from both sides of the p-n junctions 14 and 15 into the semiconductor body 17. The piezoresistive effect causes an increase in the resistance of the individual layers when a tensile force is applied to the semiconductor body. This results in a further shifting of the space charge zone toward the inside of the semiconductor body zone 17. This squeezing of the space charge zone from both sides, or all sides, in the case of an axially symmetrical-shaped semiconductor body, effects, similarly to the unipolar transistor, a reduction in the cross section of the current path. It may also cause an extension of the narrowed current path, which is especially effective at the cross-sectional area of the constriction 19, and results in an increased resistance.

The increase in resistance brings about an increase in the voltage drop along the semiconductor body and augments the piezoresistive effect. A resistance 24 is provided in the circuit and is matched or adjusted to the resistance of the semiconductor body. The resistor 24 may be replaced, in the manner described in connection with FIG. 1, by the same semiconductor body as the semiconductor body 16, 17, 18 of FIG. 2. An embodiment of the invention, similar to FIG. 1, utilizing two semiconductor bodies, is shown in FIG. 3. If the second body is stressed in the opposite direction from the first one, the effect may be doubled.

The output voltage produced by the semiconductor body 16, 17, 18 may be derived from said semiconductor body by any suitable electrode devices such as, for example, the contact 22 and contact 36. The terminal 25 is connected to the contact 22 and terminal 38 is connected to the contact 36. The contact 22 is positioned at the end of the semiconductor body opposite that of the bridge 20 and the contact 36 is preferably positioned at the end of said semiconductor body which is bridged. The output voltage may also be derived from the resistor 24.

In the emboiment of FIG. 3, two semiconductor strips or bodies are utilized; one of said semiconductor bodies replacing the resistor 11 of the embodiment of FIG. 1 or the resistor 24 of the embodiment of FIG. 2. In FIG. 3, the two semiconductor bodies are electrically connected in series. Each of the first and second semiconductor bodies 41 and 42 has a high-ohmic layer 43 and 44, respectively, and a low-ohmic layer 45 and 46, respectively. The high-ohmic layer 43 and the low-ohmic layer 45 of the first semiconductor body 41 form a p-n junction 47. The high-ohmic layer 44 and the low-ohmic layer 46 of the second semiconductor body 42 form a p-n junction 48.

As shown in FIG. 3, the high-ohmic layers 43 and 44 are thin in comparison with the low-ohmic layers 45 and 46. The high-ohmic layer 43 and the low-ohmic layer 45 of the first semiconductor body 41 are bridged at one end by a metallic connection or bridge 51 and the high-ohmic layer 44 and the low-ohmic layer 46 of the second semiconductor body 42 are bridged at the same end by a metallic connection or bridge 52.

The low-ohmic layers 45 and 46 are provided with alloyed contacts 49 and 50. For example, if the layers 43, 44, 45 and 46 have the types of conductance indicated in FIG. 3, such as an n-p-n-p sequence, the alloy contact 49 may comprise, for example, a gold-boron compound and the alloy contact 50 may comprise, for example, a gold-antimony or gold-phosphorus composition. The semiconductor bodies 41 and 42 are joined by soldering, as illustrated by a solder layer 53 in FIG. 3.

The semiconductor bodies 41 and 42 are clamped by a schematically illustrated clamp 60 at their ends opposite their bridged ends.

Electric voltage is applied at terminals 56 and 57 through contact electrodes 54 and 55 with the polarity at the terminal 56 being positive and the polarity at the terminal 57 being negative. The polarity of the applied voltage is utilized in the illustrated sequence of conductivity type layers.

When the semiconductor bodies 41 and 42 are subjected at their free ends to a mechanical force, as represented by an arrow 61, the resistance value of the layers is changed by the piezoresistive effect, particularly in the high-ohmic layers 43 and 44. The force or pressure is applied by a deforming device 62, which may constitute any suitable arrangement for applying pressure in a determined direction or directions. When the resistance of the high-ohmic layer 43 increases, the resistance in the high-ohmic layer 44 simultaneously decreases. This results in a double change in potential at an output terminal 58. The output voltage prodced by the semiconductor bodies 41 and 42 may be derived from said semiconductor bodies by any suitable electrode devices such as, for example, the terminal 58 and a terminal 59 connected to the contact 55. The terminal 58 extends from the solder layer 53 at the ends of the semiconductor bodies opposite those of the bridges 51 and 52 and the contact 55 is positioned at the end of the semiconductor body 42 opposite the end of said semiconductor body which is bridge.

It will be recognized, therefore, that the device according to the invention affords a high sensitivity. Furthermore, the mechanical coupling is simplified and external electrical connections of the semiconductor bodies are eliminated so that a rugged piezoresistive transducer is provided.

While the invention has been described by means of specific examples and in specific embodiments, I do not wish to be limited thereto, for obvious modifications will occur to those skilled in the art without departing from the spirit and scope of the invention.

I claim:

1. A mechanical to electrical transducer device, comprising a pair of elongated piezoresistive semiconductor bodies each having at least two adjacent layers of different conductivity type extending along the length of said semiconductor body and forming a p-n junction therein, one of the adjacent layers of each of said semiconductor bodies being high-ohmic relative to the other, each of said semiconductor bodies having spaced opposite first and second ends;

connecting means mechanically and electrically connecting said semiconductor bodies to each other;

an electrically conductive bridge electrically connecting the layers of different conductivity type at the first end of each of said semiconductor bodies;

support means supporting said semiconductor bodies at the second end thereof;

biasing means contacting two adjacent ones of the conductivity layers of each of said semiconductor bodies at the second end thereof for biasing the p-n junctions in the reverse direction; and deforming means for applying a deformation force to said semiconductor bodies to vary the piezoresistive effect in said conductivity layers and to control the space charge in the region of each of said p-n junctions thereby varying the cross-section and length of the current paths in said semiconductor bodies.

2. A mechanical to electrical transducer device, comprising an elongated piezoresistive semiconductor body having at least two adjacent layers of different conductivity type extending along the length of said semiconductor body and forming a p-n junction therein, one of said adjacent layers being high-ohmic relative to the other and the other of said adjacent layers being low-ohmic relative to the one and having a larger thickness relative to said one layer, said high-ohmic layer comprising n-conductivity type silicon, said semiconductor body having spaced opposite first and second ends;

an electrically conductive bridge electrically connecting the layers of different conductivity type at the first end of said semiconductor body;

support means supporting said semiconductor body at the second end thereof;

biasing means contacting each of the conductivity layers of said semiconductor body at the second end thereof for biasing the p-n junction in the reverse direction;

means electrically contacting one of the layers of said semiconductor body for deriving an output voltage from said semiconductor body; and deforming means for applying a deformation force to said semiconductor body in the crystallographic 100 direction to vary the piezoresistive effect in said conductivity layers and to control the space charge in the region of said p-n junction thereby varying the cross section and length of the current path in said high-ohmic layer to vary the piezoresistive effect in said high-ohmic layer.

3. A mechanical to electrical transducer device comprising an elongated piezoresistive semiconductor body having at least three adjacent layers of different conductivity type extending along the length of said semiconductor body and forming two spaced p-n junctions therein, one of said adjacent layers being high-ohmic relative to the other, said semiconductor body having spaced opposite first and second ends and a constriction intermediate said first and second ends;

an electrically conductive bridge electrically connecting the layers of different conductivity type at the first end of said semiconductor body and electrically short-circuiting said two p-n junctions;

support means supporting said semiconductor body at the second end thereof;

biasing means contacting two adjacent ones of the conductivity layers of said semiconductor body at the second end thereof for biasing said p-n junctions in the reverse direction;

means electrically contacting one of the layers of said semiconductor body for deriving an output voltage from said semiconductor body;

deforming means for applying a deformation force to said semiconductor body to vary the piezoresistive effect in one of said conductivity layers and to control the space charge in the region of said p-n junction thereby varying the cross section and length of the current path in said semiconductor body.

4. A mechanical to electrical transducer device comprising an elongated piezoresistive semiconductor body having at least three adjacent layers of different conductivity type extending along the length of said semiconductor body and forming two spaced p-n junctions therein, one of said adjacent layers being high-ohmic relative to the other, said semiconductor body having spaced opposite first and second ends and a constriction intermediate said first and second ends;

an electrically conductive bridge electrically connecting the layers of different conductivity type at the first end of said semiconductor body and electrically short-circuiting said two p-n junctions;

support means supporting said semiconductor body at the second end thereof;

biasing means contacting two adjacent ones of the conductivity layers of said semiconductor body at the second end thereof for biasing both of said p-n junctions in the reverse direction;

means electrically contacting one of the layers of said semiconductor body for deriving an output voltage from said semiconductor body;

deforming means for applying a deformation force to said semiconductor body to vary the piezoresistive effect in one of said conductivity layers and to control the space charge in the region of said p-n junction thereby varying the cross section and length of the current path in said semiconductor body.

5. A mechanical to electrical transducer device comprising an elongated piezoresistive semiconductor body having at least three adjacent layers of different conductivity type extending along the length of said semiconductor body and forming two spaced p-n junctions therein, one of said adjacent layers being high-ohmic relative to the other, two additional adjacent conductivity layers each forming a p-n junction with said one of said conductivity layers and each comprising a low-ohmic layer relative to said one layer, said semiconductor body having spaced opposite first and second ends and a constriction intermediate said first and second ends;

an electrically conductive bridge electrically connecting the layers of different conductivity type at the first end of said semiconductor body and electrically short-circuiting said two p-n junctions;

support means supporting said semiconductor body at the second end thereof;

biasing means contacting two adjacent ones of the conductivity layers of said semiconductor body at the second end thereof for biasing said p-n junctions in the reverse direction;

means electrically contacting one of the layers of said semiconductor body for deriving an output voltage from said semiconductor body;

deforming means for applying a deformation force to said semiconductor body to vary the piezoresistive effect in one of said conductivity layers and to control the space charge in the region of said p-n junction thereby varying the cross section and length of the current path in said semiconductor body.

6. A mechanical to electrical transducer device comprising an elongated piezoresistive semiconductor body having at least three adjacent layers of different conductivity type extending along the length of said semiconductor body and forming two spaced p-n junctions therein, one of said adjacent layers being high-ohmic relative to the other, said semiconductor body having spaced opposite first and second ends and a constriction intermediate said first and second ends;

an electrically conductive bridge electrically connecting the layers of different conductivity type at the first end of said semiconductor body and electrically short-circuiting said two p-n junctions;

support means supporting said semiconductor body at the second end thereof;

biasing means contacting two adjacent ones of the conductivity layers of said semiconductor body at the second end thereof for biasing said p-n junctions in the reverse direction;

means electrically contacting one of the layers of said semiconductor body for deriving an output voltage from said semiconductor body;

deforming means for applying a deformation force to said semiconductor body substantially perpendicularly to the cross-sectional area of said constriction to vary the piezoresistive effect in one of said conductivity layers and to control the space charge in the region of said p-n junction thereby varying the cross section and length of the current path in said semiconductor body.

7. A mechanical to electrical transducer device, comprising a pair of elongated piezoresistive semiconductor bodies each having at least two adjacent layers of different conductivity type extending along the length of said semiconductor body and forming a p-n junction therein, one of the adjacent layers of each of said semiconductor bodies being high-ohmic relative to the other, each of said semiconductor bodies having spaced opposite first and second ends;

connecting means mechanically and electrically connecting said semiconductor bodies to each other;

an electrically conductive bridge electrically connecting the layers of different conductivity type at the first end of each of said semiconductor bodies;

support means supporting said semiconductor bodies at the second ends thereof;

biasing means contacting each of the conductivity layers of each of said semiconductor bodies at the second end thereof for biasing the p-n junctions in the reverse direction;

means electrically contacting one of the layers of one of said semiconductor bodies for deriving an output voltage from one of said semiconductor bodies; and deforming means for applying a deformation force to said semiconductor bodies to vary the piezoresistive effect in said conductivity layers and to control the space charge in the region in each of said p-n junctions thereby varying the cross section and length of the current paths in said semiconductor bodies.

8. A mechanical to electrical transducer device, comprising a pair of elongated piezoresistive semiconductor bodies each having at least two adjacent layers of different conductivity type extending along the length of said semiconductor body and forming a p-n junction therein, one of the adjacent layers of each of said semiconductor bodies being high-ohmic relative to the other, each of said semiconductor bodies having spaced opposite first and second ends;

connecting means mechanically and electrically connecting said semiconductor bodies to each other;

an electrically conductive bridge electrically connecting the layers of different conductivity type at the first end of each of said semiconductor bodies;

support means supporting said semiconductor bodies at the second ends thereof;

biasing means contacting the high-ohmic conductivity layer and an adjacent layer of each of said semiconductor bodies at the second end thereof for biasing the p-n junctions in the reverse direction;

means electrically contacting one of the layers of one of said semiconductor bodies for deriving an output voltage from one of said semiconductor bodies; and deforming means for applying a deformation force to said semiconductor bodies to vary the piezoresistive effect in said conductivity layers and to control the space charge in the region in each of said p-n junctions thereby varying the cross section and length of the current paths in said semiconductor bodies.

9. A mechanical to electrical transducer device, comprising a pair of elongated piezoresistive semiconductor bodies each having at least two adjacent layers of different conductivity type extending along the length of said semiconductor body and forming a p-n junction therein, one of the adjacent layers of each of said semiconductor bodies being high-ohmic relative to the other, each of said semiconductor bodies having spaced opposite first and second ends;

connecting means mechanically and electrically connecting said semiconductor bodies to each other;

an electrically conductive bridge electrically connecting the layers of different conductivity type at the first end of each of said semiconductor bodies;

support means supporting said semiconductor bodies at the second ends thereof;

biasing means contacting each of the conductivity layers of each of said semiconductor bodies at the second end thereof for biasing the p-n junctions in the reverse direction;

means electrically contacting one of the layers of one of said semiconductor bodies for deriving an output voltage from one of said semiconductor bodies, said last-mentioned means comprising a first terminal connected to said connecting means and a second terminal connected to a part of said biasing means; and deforming means for applying a deformation force to said semiconductor bodies to vary the piezoresistive effect in said conductivity layers and to control the space charge in the region in each of said p-n junctions thereby varying the cross section and length of the current paths in said semiconductor bodies.

10. A mechanical to electrical transducer device, comprising a pair of elongated piezoresistive semiconductor bodies each having at least two adjacent layers of different conductivity type extending along the length of said semiconductor body and forming a p-n junction therein, one of the adjacent layers of each of said semiconductor bodies being high-ohmic relative to the other, each of said semiconductor bodies having spaced opposite first and second ends;

connecting means including a solder bond mechanically and electrically connecting said semiconductor bodies to each other;

an electrically conductive bridge electrically connecting the layers of different conductivity type at the first end of each of said semiconductor bodies;

support means supporting said semiconductor bodies at the second ends thereof;

biasing means contacting each of the conductivity layers of each of said semiconductor bodies at the second end thereof for biasing the p-n junctions in the reverse direction;

means electrically contacting one of the layers of one of said semiconductor bodies for deriving an output voltage from one of said semiconductor bodies; and deforming means for applying a deformation force to said semiconductor bodies to vary the piezoresistive effect in said conductivity layers and to control the space charge in the region in each of said p-n junctions thereby varying the cross section and length of the current paths in said semiconductor bodies.

11. A mechanical to electrical transducer device, comprising a pair of elongated piezoresistive semiconductor bodies each having at least two adjacent layers of different conductivity type extending along the length of said semiconductor body and forming a p-n junction therein, one of the adjacent layers of each of said semiconductor bodies being high-ohmic relative to the other of the adjacent layers being low-ohmic relative to the other, each of said semiconductor bodies having spaced opposite first and second ends;

connecting means mechanically and electrically connecting said semiconductor bodies to each other, said connecting means comprising an alloyed contact on the low-ohmic layer of each of said semiconductor bodies and a solder bond between said alloyed contacts;

an electrically conductive bridge electrically connecting the layers of different conductivity type at the first end of each of said semiconductor bodies;

support means supporting said semiconductor bodies at the second ends thereof;

biasing means contacting each of the conductivity layers of each of said semiconductor bodies at the second end thereof for biasing the p-n junctions in the reverse direction;

means electrically contacting one of the layers of one of the semiconductor bodies for deriving an output voltage from one of said semiconductor bodies; and deforming means for applying a deformation force to said semiconductor bodies to vary the piezoresistive effect in said conductivity layers and to control the space charge in the region in each of said p-n junctions thereby varying the cross section and length of the current paths in said semiconductor bodies.

12. A mechanical to electrical transducer device, comprising a pair of elongated piezoresistive semiconductor bodies each having at least two adjacent layers of different conductivity type extending along the length of said semiconductor body, one of the adjacent layers of each of said semiconductor bodies being high-ohmic relative to the other and the other of the adjacent layers of each of said semiconductor bodies being low-ohmic relative to the one and forming a p-n junction with said one of said layers, each of said semiconductor bodies having spaced opposite first and second ends;

connecting means mechanically and electrically connecting said semiconductor bodies to each other, said connecting means comprising an alloyed contact on the low-ohmic layer of each of said semiconductor bodies and a solder bond between said alloyed contacts;

an electrically conductive bridge electrically connecting the layers of different conductivity type at the first end of each of said semiconductor bodies;

support means supporting said semiconductor bodies at the second ends thereof;

biasing means contacting each of the conductivity layers of each of said semiconductor bodies at the second end thereof for biasing the p-n junctions in the reverse direction, said biasing means comprising a pair of contacts contacting the high-ohmic layer of each of said semiconductor bodies and means for applying voltage to said terminals;

an output comprising a first terminal connected to the solder bond of said connecting means and a second terminal connected to a terminal of said biasing means; and deforming means for applying a deformation force to said semiconductor bodies to vary the piezoresistive effect in said conductivity layers and to control the space charge in the region of each of said p-n junctions thereby varying the cross section and length of the current paths in said semiconductor bodies.

References Cited

UNITED STATES PATENTS

| | | | |
|---|---|---|---|
| 2,954,486 | 9/1960 | Doucette et al. | 307—88.5 |
| 3,034,345 | 5/1962 | Mason | 317—235 X |
| 3,049,685 | 8/1962 | Wright | 338—2 |
| 3,160,844 | 12/1964 | McLellan | 338—4 |
| 3,186,217 | 6/1965 | Pfann | 73—88.5 |
| 3,196,668 | 7/1965 | McLennan. | |
| 3,270,554 | 9/1966 | Pfann. | |

JOHN W. HUCKERT, Primary Examiner

M. EDLOW, Assistant Examiner

U.S. Cl. X.R.

307—299; 317—234

UNITED STATES PATENT OFFICE

CERTIFICATE OF CORRECTION

Patent No. 3,460,004 August 5, 1969

Walter Heywang

It is certified that error appears in the above identified patent and that said Letters Patent are hereby corrected as shown below:

In the heading to the printed specification, between line 6 and 7, insert -- Claims priority, application Germany, Aug. 20, 1963, S 86,812; July 14, 1964, S 92,044 --.

Signed and sealed this 21st day of April 1970.

(SEAL)
Attest:

Edward M. Fletcher, Jr.
Attesting Officer

WILLIAM E. SCHUYLER, JR.
Commissioner of Patents